Sept. 10, 1974 K. E. BEAN ET AL 3,834,958

METHOD FOR ISOLATION OF CIRCUIT REGIONS IN MONOLITHIC INTEGRATED CIRCUIT STRUCTURE

Original Filed Feb 17, 1969 2 Sheets-Sheet 1

United States Patent Office 3,834,958
Patented Sept. 10, 1974

3,834,958

METHOD FOR ISOLATION OF CIRCUIT REGIONS IN MONOLITHIC INTEGRATED CIRCUIT STRUCTURE

Kenneth E. Bean, Richardson, and Paul S. Gleim, Dallas, Tex., assignors to Texas Instruments Incorporated, Dallas, Tex.

Original application Feb. 17, 1969, Ser. No. 799,721, now Patent No. 3,624,467. Divided and this application Dec. 17, 1970, Ser. No. 99,289
Int. Cl. H01l 7/50
U.S. Cl. 156—8 4 Claims

ABSTRACT OF THE DISCLOSURE

Polycrystalline silicon having a needle-like oriented grain structure is found to have anisotropic electrical and thermal properties. A monolithic integrated circuit structure having a plurality of monocrystalline silicon islands is fabricated in a polycrystalline silicon matrix having such a grain structure, with the grain direction oriented to provide maximum electrical resistivity between the monocrystalline islands, and maximum thermal conductivity toward a header or other heat sink. In one embodiment, the monocrystalline islands and polycrystalline matrix are grown by vapor deposition of silicon on a monocrystalline substrate provided with a suitable masking pattern, whereby the polycrystalline material grows on the mask concurrently with the growth of monocrystalline silicon on the unmasked areas of the substrate.

This application is a division of application Ser. No. 799,721, filed Feb. 17, 1969, now U.S. Pat. 3,624,467 issued Nov. 30, 1971.

This invention relates to a monolithic integrated circuit structure including an array of isolated monocrystalline silicon islands, and to a method for its fabrication. More particularly, the invention relates to such a structure wherein dielectric isolation of the monocrystalline islands is provided by a polycrystalline silicon matrix having an oriented needle-like grain structure characterized by anisotropic electrical and thermal properties.

Monolithic integrated circuit structures comprising an array of monocrystalline semiconductor regions electrically isolated by one or more discrete layers of a dielectric material represent a substantial advance in many respects over the more common use of p-n junction isolation to provide electrical separation between circuit elements. Perhaps the most significant advantage of the so-called multiphase monolithic integrated circuit is the elimination of parasitic capacitance between the substrate and active elements of the circuit. Also eliminated in the multiphase structure is the parasitic transistor consisting of the base-collector-substrate combination, characteristic of the conventional monolithic circuit.

Polycrystalline silicon has been frequently suggested as a matrix material to be used in the fabrication of multiphase monolithic integrated circuits because it has a coefficient of thermal expansion substantially equal to that of the monocrystalline silicon regions. However, since polycrystalline silicon normally does not have a sufficient electrical resistivity to provide the required isolation, it has previously been necessary to provide a continuous layer of silicon dioxide or other dielectric material between the monocrystalline regions and the polycrystalline silicon substrate of such structures. It has now been discovered that when polycrystalline silicon is grown in such a manner as to provide an oriented needle-like grain structure, the material has anisotropic electrical and thermal properties. Specifically, maximum electrical and thermal conductivity are observed in the direction of the grain, and a minimum electrical and thermal conductivity are observed in a direction perpendicular to the grain structure. Measurements parallel to the grain structure have indicated a thermal conductivity of about 0.9 watts per cm. per degree centigrade at about 100° C., whereas perpendicular to the grain structure a thermal conductivity of about 0.6 watts per cm. per degree centigrade was observed. An electrical resistivity of $5.2 \times 10^4$ ohm-cms. was observed parallel to the grain direction, and $5.9 \times 10^5$ ohms-cms. perpendicular to the grain direction. These properties have been found particularly advantageous in the construction of a multiphase monolithic integrated circuit structure, as will be apparent from a consideration of the specific embodiments of the invention described below.

It is an object of the invention to provide an improved monolithic integrated circuit structure. More particularly, it is an object of the invention to provide a monolithic integrated circuit structure having a plurality of electrically isolated monocrystalline silicon islands embedded in a polycrystalline silicon matrix, characterized by improved dissipation of heat generated in the monocrystalline islands, and increased packing density of circuit elements.

It is a further object of the invention to provide an improved method for the fabrication of a monolithic integrated circuit structure and, in one aspect, to provide a method for the fabrication of an all-silicon structure, characterized by monocrystalline silicon islands embedded in a polycrystalline silicon matrix. It is a further object of the invention to provide a method involving the concurrent growth of monocrystalline and polycrystalline silicon for the fabrication of a monolithic structure wherein monocrystalline islands are surrounded by a polycrystalline matrix having an oriented needle-like grain structure.

The invention is embodied in a monolithic integrated circuit structure including a polycrystalline silicon matrix having an oriented needle-like grain structure, and a plurality of monocrystalline silicon islands contained in the matrix. Each monocrystalline island includes a substantially planar surface oriented perpendicular to the grain of the polycrystalline matrix. Such orientation takes advantage of the anisotropic electrical and thermal properties of the polycrystalline matrix. That is, the electrical resistivity between islands is maximized since that direction is perpendicular to the matrix grain, whereas dissipation of heat from the monocrystalline islands is optimized in a direction parallel with the grain structure of the matrix. The completed structure includes at least one circuit element within each of a selected number of monocrystalline islands, in combination with means for providing suitable electrical interconnection of the circuit elements. Actually, it will be apparent that each island may include a circuit element. Frequently, however, some of the islands are not needed to complete a given circuit design, and would therefore not be used.

The invention is further embodied in a monolithic integrated circuit structure including a polycrystalline silicon matrix having a substantially planar surface and a needle-like grain structure oriented substantially perpendicular to the planar surface. An array of monocrystalline silicon islands are located in the matrix, each island having a surface lying substantially in the same plane as said matrix surface. As noted above, the completed structure includes at least one circuit element within each of selected monocrystalline islands, in combination with means for electrically interconnecting the elements. In accordance with a preferred embodiment, each island forms a monocrystalline-polycrystalline interface with the matrix. In such a structure, the usual layer of silicon dioxide is eliminated, thereby facilitating the dissipation of heat from each island into the polycrystalline matrix, and subsequently to a header or other heat sink.

The invention is also embodied in a method for the fabrication of a monolithic integrated circuit structure, beginning with the steps of providing a monocrystalline silicon body having a substantially planar surface, and forming on said surface a suitable masking layer patterned to provide therein a plurality of spaced apart openings. The masked silicon body is exposed to an atmosphere containing a vaporous or gaseous silicon compound, at epitaxial growth conditions, whereby monocrystalline silicon islands are formed on the exposed portions of the silicon surface, surrounded by polycrystalline silicon concurrently deposited on the mask. Preferably, the concurrent growth of monocrystalline and polycrystalline silicon is continued until a thickness is achieved sufficient to provide the necessary structural strength of the vapor-deposited layer, after subsequent removal of the original monocrystalline substrate. At least one circuit element is formed in each of selected monocrystalline islands, and the elements are suitably interconnected electrically. The formation of circuit components and/or the step of electrically interconnecting said components may be carried out either before or after the removal of the original monocrystalline silicon substrate.

In accordance with a more specific embodiment of the above method, the planar surface of the monocrystalline silicon body initially provided has a (110) crystallographic orientation. By providing such orientation, the geometry of the masking layer is preserved or transferred through the entire thickness of the deposited silicon. That is, the interface between the deposited monocrystalline and polycrystalline silicon remains perpendicular to the substrate surface throughout the entire operation. The ability to so maintain a perpendicular interface permits the deposited material to be grown as thick as desired without departing substantially from the geometric pattern initially provided in the masking layer.

The geometry of the interface between monocrystalline and polycrystalline silicon is improved still further, in accordance with a more specific embodiment of the method, by patterning the masking layer to provide openings having at least one side oriented parallel to the intersection of a (111) plane with the (110) plane of the substrate surface. Preferably the mask windows are parallelograms having each side oriented parallel to an intersection of a (111) plane with the substrate surface. The controlled deposition of silicon on such a masked substrate proceeds smoothly to provide substantially planar walls between each monocrystalline island and the surrounding polycrystalline matrix.

In an alternate embodiment, the concurrent growth of monocrystalline and polycrystalline silicon is interrupted when a thickness is achieved corresponding substantially to the thickness which a monocrystalline island must have in order to accommodate whatever circuit elements are to be formed therein. Then the composite layer of monocrystalline and polycrystalline silicon is covered by a suitable dielectric material, followed by the deposition of additional polycrystalline silicon on the dielectric layer, followed by removal of the original silicon substrate.

In another embodiment, the method of the invention begins with the steps of providing a monocrystalline silicon body having a substantially planar surface, and selectively etching said surface to form is network of channels therein and a plurality of raised, mesa-like regions. Polycrystalline silicon having a needle-like grain structure oriented perpendicular to the substrate surface is then deposited on the etched surface. Monocrystalline silicon is removed from the reverse side of the substrate until a portion of the channel network becomes exposed, thereby isolating a plurality of monocrystalline regions surrounded by polycrystalline silicon, each monocrystalline region having a surface perpendicular to the grain structure of said polycrystalline matrix. The structure is then completed by forming at least one circuit component in each of selected monocrystalline regions and suitably interconnecting the components electrically.

Polycrystalline silicon is generally known to have a grain structure; and an elongated or "needle-like" grain shape has been previously observed. But a needle-like grain structure wherein the longitudinal axes of the individual grains point randomly in all directions is not "oriented." Thus, at least for purposes of this disclosure, the term "oriented needle-like grain structure" refers to a grain structure wherein the majority of the individual grains have longitudinal axes arranged in some orderly pattern. Usually, in accordance with the invention, the grain direction is substantially perpondicular to the surface on which the polycrystalline silicon is being grown. Accordingly for deposition on a planar surface, the oriented grains all point in the same direction, i.e., substantially parallel to each other.

FIGURES 1–4

Monocrystalline silicon wafer 11, having a diameter of about 1 inch and a thickness of about 8 mils, is prepared from known techniques, or is obtained from known sources. Preferably, wafer 11 has a crystallographic orientation to provide a working surface having a (110) orientation. Layer 12 of silicon dioxide is formed on the surface of wafer 11 by any suitable technique including, for example, thermal oxidation or the vapor-deposition of silicon dioxide from an organic silicon compound in an oxidizing atmosphere, at deposition conditions. Layer 12 has a thickness of 100 to 100,000 angstroms and preferably about 10,000 angstroms. Masking layer 12 is then patterned to provide windows 13, using known photolithographic techniques. The size and arrangement of windows 13 correspond to the desired size and arrangement of monocrystalline silicon islands to be isolated in a ploycrystalline silicon matrix. Preferably the masking pattern includes parallelogram windows, each side of which is parallel to the intersection of a (111) plane with the surface of wafer 11.

Figure 1:
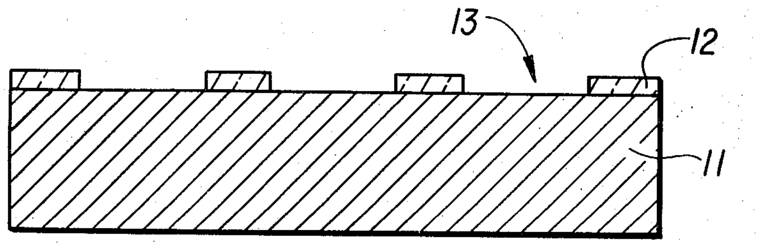
FIGS. 1, 2 and 3 are cross-sectional views of a semiconductor wafer, illustrating a sequence of intermediate stages carried out in the practice of one embodiment of the invention.
Figure 2:
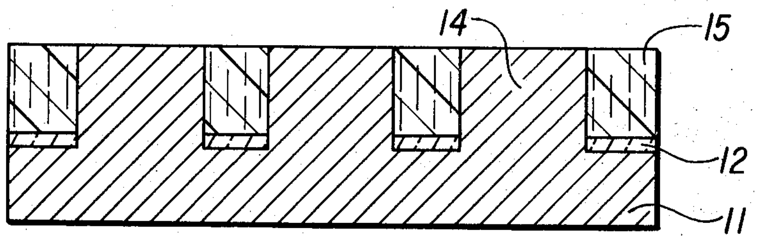

The structure of FIG. 1 is then subjected to suitable conditions for the concurrent growth of monocrystalline silicon in the windowed areas and the growth of polycrystalline silicon on mask patern 12 to provide the structure as illustrated by FIG. 2. The preferred conditions for silicon growth include a molar ratio of silicon halide (or silicon hydride) to hydrogen of 1% to 4% and preferably about 2–3%. Substrate temperature is maintained in the range of 900°–1350° C., and preferably about 1150°–1300° C. These conditions are suitable, not only because high quality monocrystalline silicon is deposited in windowed areas 13, but primarily due to the fact that these conditions ensure the formation of an oriented needle-like grain structure in polycrystalline silicon region 15. The resulting grain structure is perpendicular to the surface of masking layer 12. Such orientation is preferred because the grain structure exhibits a maximum electrical resistivity perpendicular to the grain direction, thereby providing a maximum electrical isolation of monocrystalline islands 14.

A specific example of the process is carried out in a vertical reactor system characterized by an indirect flow pattern for reactor gases. Such a system is available from Ecco High Frequency, Inc. of North Bergen, N.J. In a ten-slice reactor (1.5 in. diameter slices) having a dome size of about 9⅞" I.D. and a 7¼" susceptor, suitable results are obtained using a temperature of 1150° C. and a total flow rate of about 40 liters per minute, consisting of 3% trichlorosilane and 97% hydrogen.

Figure 3:
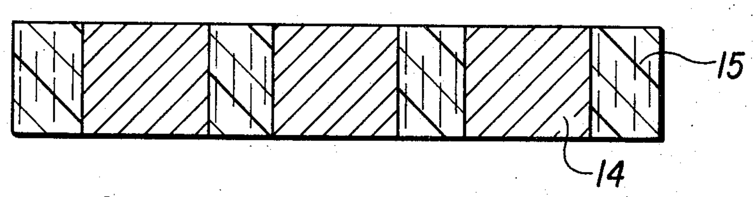

The original substrate 11 and masking pattern 12 are then removed by lapping, polishing and/or etching techniques to produce a structure as shown in FIG. 3 which consists essentially of monocrystalline islands 14 surrounded by polycrystalline silicon matrix 15.

Figure 4:
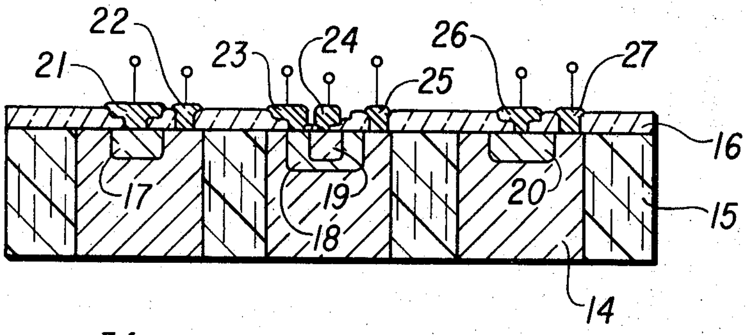
FIG. 4 is a cross-sectional view of a structure completed in accordance with the invention, representing the product of the method illustrated by FIGS. 1, 2 and 3.

As shown in FIG. 4, the structure of FIG. 3 is completed by providing oxide layer 16, to be used as a diffusion mask in the formation of diffused regions 17, 18, 19 and 20 which represent suitable active and/or passive circuit components fabricated within islands 14, including diodes, transistors, resistors, etc., for example. The fabrication of such diffused regions or other active or passive components is carried out in accordance with known techniques which need not be disclosed in detail for the purpose of understanding the present invention. Suitable ohmic contacts 21–27 are then provided, also in accordance with known techniques which need not be described in detail for purposes of the present disclosure. The resulting integrated circuit structure represents an advance in the art, primarily due to the increased rate of thermal dissipation made possible by elimination of the usual dielectric layer interposed between such a polycrystalline matrix and each of the monocrystalline islands. The present approach also reduces the cost of fabrication and increases the packing density of circuit elements. Still further, this embodiment permits selective gold diffusion from the back side of the wafer to provide separate control of minority carrier lifetimes within each island. The back side of the wafer is also available for ohmic contacts, such as to a collector region, for example.

In an alternate embodiment, the silicon deposited on the structure of FIG. 1 is doped to provide the opposite conductivity type with respect to substrate 11. That is, a p-n junction is formed epitaxially at the level of windows 13. Thus, a structure is provided essentially the same as shown in FIG. 2, but with p-n junction isolation of "islands" 14 in the vertical direction, and matrix isolation horizontally. Accordingly, device fabrication is then possible as the next step, without the need to remove any of the original substrate.

FIGS. 5–7

Figure 5:
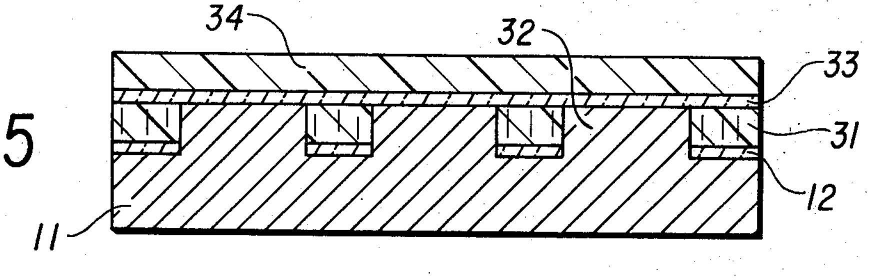
FIGS. 5 and 6 are cross-sectional views of a semiconductor wafer, illustrating a sequence of steps carried out in accordance with a second embodiment of the invention.

In accordance with a further embodiment, the sequence of FIGS. 1–4 is slightly altered, first by limiting the thickness of both the monocrystalline and polycrystalline regions deposited upon the masked wafer structure. As shown in FIG. 5, the polycrystalline silicon areas 31 and monocrystalline regions 32 are grown to a thickness of only 1–2 mils, which thickness is insufficient to avoid breakage in the event that the original substrate 11 were to be removed as in the previous embodiment. Accordingly, in order to provide such structural strength, oxide layer 33 or other dielectric material is deposited across the composite surface of the deposited regions, followed by the continued growth of polycrystalline silicon to provide a structural base 34. Polycrystalline silicon is employed to provide base 34 primarily for convenience; other materials can readily be substituted therefor.

Figure 6:
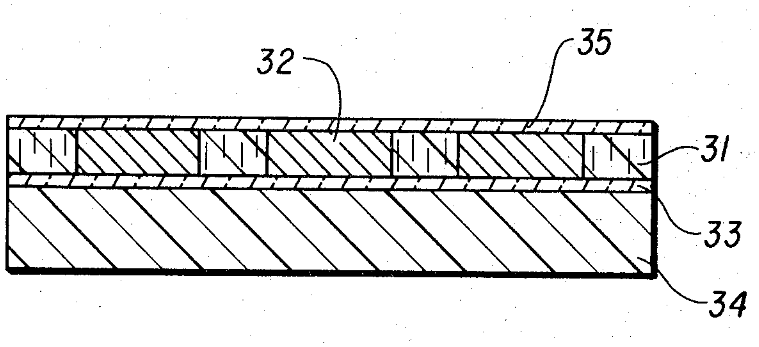
Figure 7:
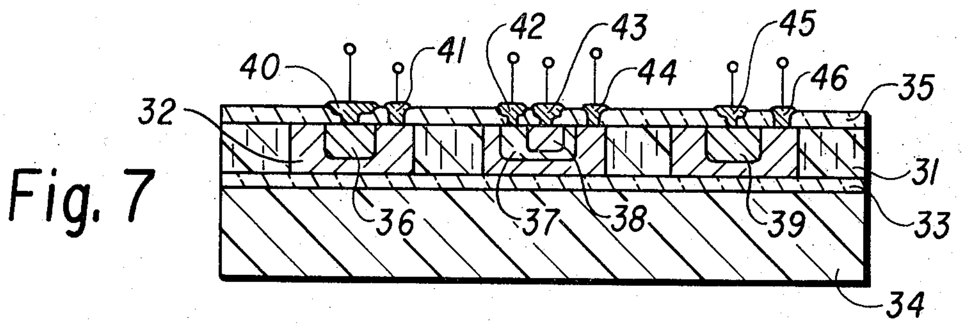
FIG. 7 is a cross-sectional view of a completed structure made in accordance with the method illustrated by FIGS. 5 and 6.
Figure 8:
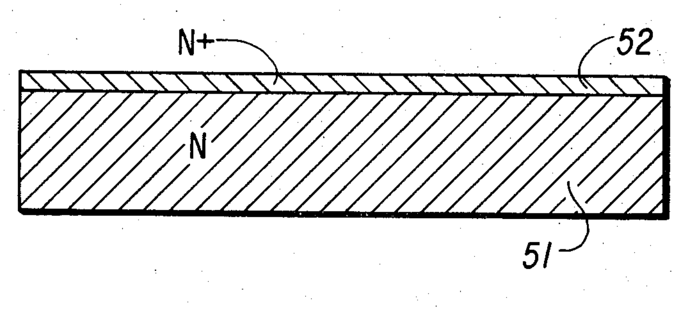
FIGS. 8 and 9 are cross-sectional views of a semiconductor wafer, illustrating a sequence of steps performed in accordance with a third embodiment of the invention.
Figure 9:
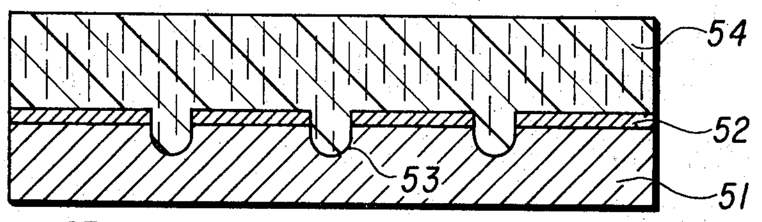

Next, the original substrate 11 is removed, as before, by known techniques including for example, a combination of lapping, polishing and etching procedures to produce a structure essentially as shown in FIG. 6. Oxide layer 35 is then provided on the lapped and polished composite surface of regions 31 and 32.

The structure is completed by the formation of diffused regions 36–39 in accordance with known techniques to provide suitable circuit elements within the monocrystalline islands. Thereafter, suitable ohmic contacts 40–46 are provided, also in accordance with known techniques, to establish the necessary means for interconnection of the circuit components. A more detailed description of component fabrication and ohmic contact placement is unnecessary for purposes of the present disclosure.

FIGS. 8–10

Monocrystalline silicon wafer 51, having n-type conductivity, a resistivity of about 0.4 to 0.6 ohm-cm., a thickness of about 8 mils, and a diameter of about 1 inch, is prepared by known techniques or obtained from known sources. A diffused or epitaxially grown region 52 having the same conductivity type but a substantially lower resistivity is provided by known techniques. Region 52 has a thickness, for example, of 2 to 6 microns, preferably about 4 microns.

Next, using known selective etching techniques, a channel network pattern 53 is provided in the surface of wafer 51. The depth and geometric pattern of channel network 53 is selected to provide an array of raised, mesa-like regions corresponding in size and thickness to the desired dimensions of monocrystalline silicon islands to be provided in the completed structure. Polycrystalline silicon layer 54 is then deposited on the channeled surface of wafer 51. Since the polycrystalline silicon is deposited directly upon a monocrystalline silicon surface, process conditions must be selected to avoid monocrystalline epitaxial growth. For example, the growth of layer 54 may be initiated at a temperature which is too low for monocrystalline growth, resulting initially in the deposition of an amorphous silicon layer (not shown) having a thickness just sufficient to interrupt the monocrystalline lattice. Thereafter, conditions may be modified to generate an optimum growth of polycrystalline silicon. Preferably, the previously mentioned conditions for forming an oriented needle-like grain structure are employed. Polycrystalline region 54 is grown to a thickness just sufficient to provide the necessary structural integrity required for subsequent handling.

Figure 10:
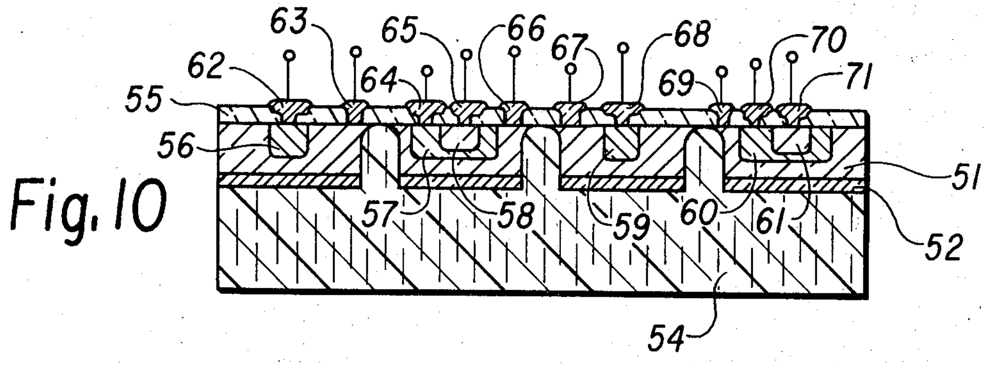
FIG. 10 is a cross-sectional view of a completed structure prepared by the method illustrated in FIGS. 8 and 9.

Next, as shown in FIG. 10, a portion of the original wafer 51 is removed by known lapping, polishing and/or etching techniques until channel pattern 53 is clearly exposed, thereby isolating an array of monocrystalline regions in which circuit components are to be fabricated. Oxide layer 55 is then deposited by known techniques to serve as the diffusion mask and passivation layer. Next, in accordance with known techniques, diffused regions 56–61 are formed in the respective monocrystalline islands to provide suitable circuit components. Ohmic contacts 62–71 are then provided to the respective component regions using known techniques, thereby providing suitable means for electrical interconnection of the respective circuit components.

In the illustrated embodiment, region 52 is formed prior to the etching of channel network 53. However, for some applications it is preferred to etch first and then form an N+ layer which follows the contour of the channels. This provides a so-called "wrap-around" path of low resistivity in the completed structure, which facilitates surface collector contacts.

For each of the specific embodiments described, a direct interfacing of the monocrystalline islands with the polycrystalline matrix is shown. However, it is also within the scope of the invention, in its broadest aspects, to interpose a thin layer of $SiO_2$ or other dielectric between the islands and the matrix. The combination of increased electrical resistivity in the matrix, plus the added electrical isolation of an exceptionally thin $SiO_2$ layer provides an advantageous structure, since the $SiO_2$ layer can be thin enough to permit adequate thermal dissipation, without risking any serious failure due to electrical leaks in the event of pinholes or other discontinuities in the $SiO_2$.

What is claimed is:

1. In a method for electrically isolating islands of monocrystalline silicon in the fabrication of a monolithic integrated circuit, said method comprising:

forming a patterned masking layer on a substantially planar surface of a monocrystalline silicon body having a (110) crystallographic orientation wherein a plurality of spaced apart openings are provided in the patterned masking layer to expose separate portions of the planar surface of said monocrystalline silicon body with the openings being arranged to have respective sides oriented parallel to the intersection of a (111) plane with the exposed separate portions of the planar surface of said monocrystalline silicon body, exposing the masked monocrystalline silicon body to a silicon-containing atmosphere under conditions favoring the epitaxial growth of silicon, and forming respective upstanding monocrystalline silicon growths on the exposed separate portions of said planar surface of said monocrystalline silicon body while simultaneously forming an upstanding polycrystalline silicon growth upon the masking layer as a needle-like grain structure oriented perpendicular to the surface of the masking layer to define a polycrystalline silicon matrix separating the monocrystalline silicon growths from each other in response to the exposure of the masked monocrystalline silicon body to the silicon-containing atmosphere.

2. A method as set forth in claim 1, wherein said monocrystalline silicon body is of one conductivity type, and wherein the masked monocrystalline silicon body of said one conductivity type is exposed to a silicon-containing atmosphere including a dopant material of a kind producing the opposite conductivity in silicon under conditions favoring the epitaxial growth of silicon, whereby the respective upstanding monocrystalline silicon growths are formed of opposite conductivity type to said one conductivity type of said monocrystalline silicon body to provide respective P-N junctions between each of said monocrystalline silicon growths of opposite conductivity type and said monocrystalline silicon body of said one conductivity type.

3. A method as set forth in claim 1, further including forming an insulation layer covering the monocrystalline silicon growths and the polycrystalline silicon matrix, forming a layer of polycrystalline silicon covering said insulation layer to provide a structural base of polycrystalline silicon, and removing the original monocrystalline silicon body and the patterned masking layer provided on the planar surface thereof, thereby forming a plurality of islands of monocrystalline silicon from the monocrystalline silicon growths respectively separated from each other by the polycrysalline silicon matrix.

4. A method as set forth in claim 3, further including forming a second insulation layer covering the monocrystalline silicon islands and the polycrystalline silicon matrix separating said monocrystalline silicon islands from each other.

References Cited

UNITED STATES PATENTS

| | | | |
|---|---|---|---|
| 3,475,661 | 10/1969 | Iwata et al. | 317—234 |
| 3,607,466 | 9/1971 | Miyazaki | 148—175 |
| 3,290,723 | 12/1966 | Chang | 29—25.3 |
| 3,623,218 | 11/1971 | Mitari et al. | 29—577 |

WILLIAM A. POWELL, Primary Examiner

U.S. Cl. X.R.

156—17